(12) United States Patent
Chizawa

(10) Patent No.: US 6,741,373 B1
(45) Date of Patent: May 25, 2004

(54) IMAGE READING APPARATUS AND ILLUMINATION DRIVING METHOD THEREFOR

(75) Inventor: Noriyoshi Chizawa, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 579 days.

(21) Appl. No.: 09/675,001

(22) Filed: Sep. 29, 2000

(30) Foreign Application Priority Data

Oct. 15, 1999 (JP) .......................................... 11-294451

(51) Int. Cl.7 ............................. H04N 1/04; H01L 27/00
(52) U.S. Cl. ..................... 358/475; 358/474; 358/483; 250/208.1
(58) Field of Search ................................ 358/475, 474, 358/483; 250/208.1

(56) References Cited

U.S. PATENT DOCUMENTS

| | | | |
|---|---|---|---|
| 5,258,857 A | * | 11/1993 | Ichinose .................... 358/474 |
| 5,744,795 A | * | 4/1998 | Bianchi et al. ............. 250/234 |
| 5,917,620 A | | 6/1999 | Hasegawa et al. .......... 358/513 |
| 5,956,087 A | | 9/1999 | Takayama et al. .......... 348/275 |
| 6,386,452 B1 | * | 5/2002 | Kawamura .................. 235/454 |

* cited by examiner

*Primary Examiner*—Edward Coles
*Assistant Examiner*—Houshang Safaipour
(74) *Attorney, Agent, or Firm*—Fitzpatrick, Cella, Harper & Scinto

(57) ABSTRACT

An image reading apparatus employing a white fluorescent lamp, such as a xenon lamp, as an illuminating unit reduces variations in RGB output level caused by differences in persistence characteristics of phosphors, and also reduces color blurs at document edges in a vertical scanning direction. The lamp is turned on a plurality of times within one storage time of a CCD line sensor, and a lamp-on phase is shifted 180 or 90 degrees for each storage cycle or for each reading line. The lamp is not turned on at a timing when charges are transferred from a photoelectric converting element of the line sensor. Furthermore, a time from the moment when the lamp turns on last within the storage time to the timing at which the charges are transferred is set to be longer than a shortest afterglow time (B or blue) of the fluorescent lamp.

18 Claims, 12 Drawing Sheets

IMAGE READING APPARATUS AND ILLUMINATION DRIVING METHOD THEREFOR

BACKGROUND OF THE INVENTION

1. Field of the Invention

The present invention relates to an image reading apparatus, such as a digital copying machine or an image scanner, and an illumination drive method in the image reading apparatus. More particularly, the present invention relates to driving a fluorescent lamp at a high frequency.

2. Description of the Related Art

A variety of light sources are available for use with an image reading apparatus, such as a digital copying machine or a flat-bed scanner. Examples of such light sources include halogen lamps and fluorescent lamps of a hot or cold cathode type employing mercury vapor.

Halogen lamps have conventionally been used most frequently as light sources in digital copying machines. The halogen lamps are advantageous primarily in that a quantity of light and light distribution can be adjusted, and the quantity of light and hue are stable. The halogen lamps, however, are disadvantageous in that they require significant electric power because approximately 80% or more of the consumed power turns into heat. They are also susceptible to vibration because they employ filaments to emit light.

Flat-bed scanners mainly use fluorescent lamps because of their advantages of lower power consumption and longer service lives. Studies are being vigorously conducted to improve the efficiency of fluorescent lamps expected to be light sources for replacing halogen lamps in digital copying machines with higher productivity. The fluorescent lamps are starting to attract attention as light sources for replacing the halogen lamps in digital color copying machines that are required to provide high image quality.

Structurally, the fluorescent lamps come in several types; some of typical ones will be described below.

(1) Hot Cathode Fluorescent Lamp

This type has filaments releasing thermoelectrons at both ends of a fluorescent tube containing mercury vapor. The mercury is excited by released thermoelectrons and turned into visible light by a phosphor applied to the inside of the tube. The quantity of the thermoelectrons to be released is controlled by the electric current passed through the filaments thereby adjusting the quantity of light.

(2) Cold Cathode Fluorescent Lamp

In a cold cathode fluorescent lamp, a high voltage is applied to electrodes at both ends of a fluorescent tube to effect gas separation. This type of fluorescent lamp generally employs mercury vapor, and its name comes from the fact that it generates less heat than the hot cathode type. The cold cathode type features a service life that is longer than those of the hot cathode type by one order of magnitude or more because the electrodes are not exhausted.

(3) External-electrode Type Rare Gas Fluorescent Lamp

This type of lamp is represented by a xenon lamp having its fluorescent tube filled with a xenon gas. A high voltage is applied across the electrodes, which are provided so that they oppose each other outside the fluorescent tube, in order to excite xenon atoms which are turned into visible light by a phosphor. The type of components allows a longer service life; however, the use of xenon gas, which is more difficult to separate than mercury, requires that a higher voltage be applied and the external electrodes be provided with insulation. Generally, it is difficult to control a high voltage that is applied, so the quantity of light cannot be adjusted over a wide range.

The principle of luminescence applied to all types of lamps described above is that atoms sealed in the tubes are excited and converted into visible light by phosphors. Hence, the luminescence properties depend heavily on the characteristics of phosphors.

FIG. 9 shows emission spectrum characteristics of a typical white xenon lamp.

As shown in the graph, the white xenon lamp has a plurality of peaks, and is generally known as a three-wavelength type. Although the characteristics differ, depending on the manufacturer, most white fluorescent tubes in current use are of the three-wavelength type.

FIG. 10 illustrates differences in the luminescence properties of the three-wavelength type white fluorescent lamps and, more particularly, differences in RGB persistence characteristics. The RGB in the diagram may be considered equivalent to outputs of a CCD line sensor in a color image reading apparatus.

Light emitted by one lamp-on control maintains luminescence for a certain period of time while it weakens its luminous intensity according to the persistence characteristics of a luminescencer. As illustrated, the persistence characteristic of B (blue) is extremely shorter than that of R (red) or G (green). It is well accepted that the persistence characteristics of phosphors are such that R and G are about a few milliseconds (msec), and B is about a few microseconds ($\mu$sec).

The differences in the persistence characteristics among R, G, and B have conventionally been presenting problems described below. The problems include irregular line cycles caused by variations in a luminescent integral value of each line, and color blurs on edges of documents in the vertical scanning direction.

The problem of the irregular line cycles will be first described with reference to FIG. 11.

In an example shown in FIG. 11, a lamp is turned on every 80 $\mu$sec asynchronously with a video processing system of an apparatus, and image signals are captured every 250 $\mu$sec. The persistence characteristics of the lamp, afterglow of R and G can be ignored relative to the lamp-on cycle of 80 $\mu$sec, so that substantially uniform characteristics are observed. The afterglow of B is, however, short (typically a few $\mu$sec), exhibiting the persistence characteristic relative to lamp-on signals as illustrated in the diagram. Therefore, a CCD output level of B varies on a line basis, leading to the above first problem, namely, irregular line cycles.

The problem of color blurs at the edges in the vertical scanning direction will now be described with reference to FIG. 12.

As illustrated, image signals are captured at 250-$\mu$sec intervals, and the lamp is turned on once for each line in synchronization with the video processing system. Since the afterglows of the persistence characteristic of R and G are in the msec order, the influences by the afterglow of R and G can be ignored also under the condition shown in the diagram. The afterglow of B occurs in synchronization with the lamp-on signals, and extinguishes in a few $\mu$sec from the moment a lamp-on signal turns OFF.

In the example shown in FIG. 12, an edge of a document image appears at a fourth line counted from a first line. If the document edge is located at a position where the lamp-on signal turns ON, then a balance of an RGB output of the CCD is ruined at the fourth line, resulting in the occurrence of a color blur at the edge.

SUMMARY OF THE INVENTION

The present invention is an attempt to solve the problems described above, and it is an object of the invention to provide an image reading apparatus capable of reducing output level fluctuations caused by differences in persistence characteristics of phosphors, and also reducing color blurs at edges of documents in a vertical scanning direction, and an illumination drive method for the same.

According to one aspect of the present invention, there is provided an image reading apparatus. This apparatus includes an illuminating unit adapted to illuminate a target. A photoelectric converting unit reads an image of target illuminated by the illuminating unit. A driving unit drives the illuminating unit such that the illuminating unit turns on a plurality of times during one storage period of time of the photoelectric converting unit. A lamp-on phase is changed based on a storage cycle of the photoelectric converting unit.

According to another aspect of the present invention, there is provided an illumination driving method for an image reading apparatus adapted to read, by photoelectric converting unit, a target illuminated by illuminating unit. A lamp is turned on a plurality of times during one storage period of time of the photoelectric converting unit and a lamp-on phase is changed based on a storage cycle of the photoelectric converting unit.

According to yet another aspect of the present invention, there is provided a storage medium storing a program for carrying out control such that a lamp is turned on a plurality of times during one storage period of time of photoelectric converting unit. A lamp-on phase is changed based on a storage cycle of the photoelectric converting unit when driving an illuminating device of an image of target reading apparatus for reading, by the photoelectric converting unit, a target illuminated by illuminating unit.

Further objects, features and advantages of the present invention will become apparent from the following description of the preferred embodiments with reference to the attached drawings.

DESCRIPTION OF THE PREFERRED EMBODIMENTS

Preferred embodiments of the present invention will now be described.

First Embodiment

Figure 1:
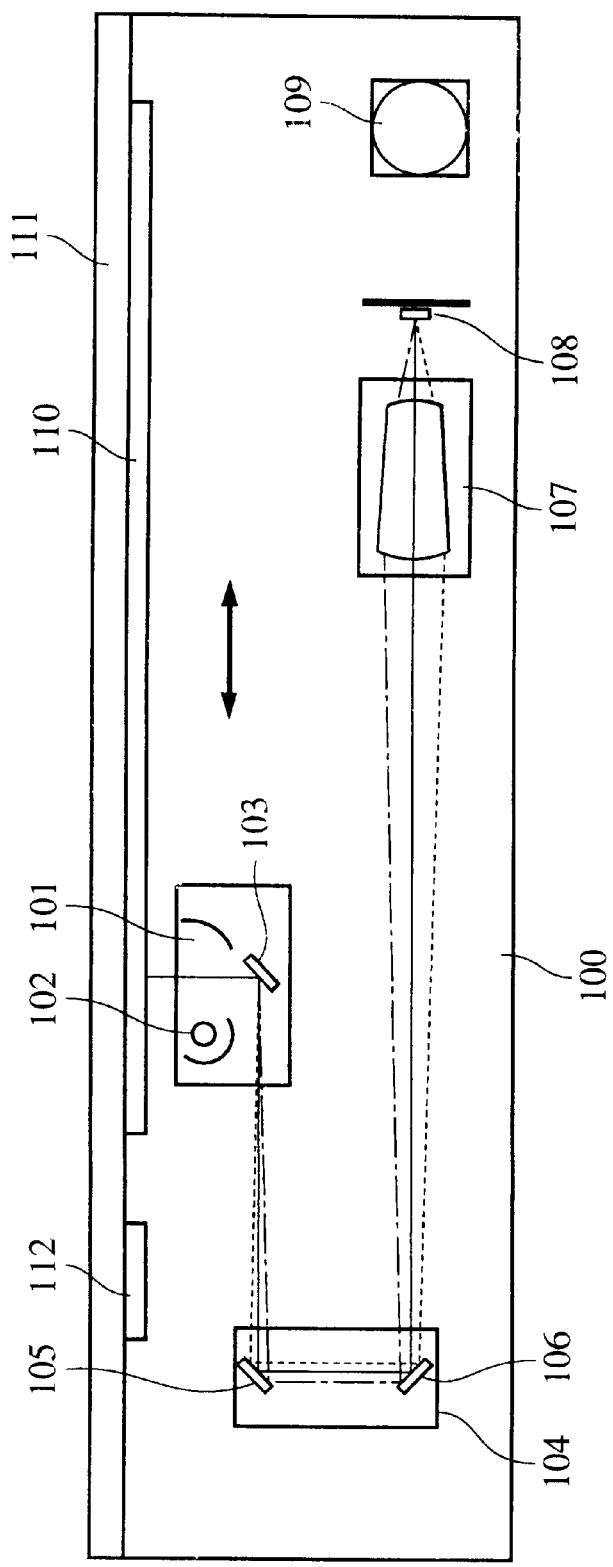
FIG. 1 is a block diagram of an image reading section of an image reading apparatus.

FIG. 1 shows a configuration of an image reading section of an image reading apparatus according to a first embodiment of the present invention.

A first mirror base 101 of an image reading apparatus 100 has a xenon lamp 102 and a first mirror 103 mounted thereon. A second mirror base 104 has a second mirror 105 and third mirror 106 mounted thereon. These first mirror base 101 and a second mirror base 104 are moved in directions of arrows (in a vertical scanning direction and its opposite direction) at a speed ratio of 1:2 thereby reading an image on a document placed on a document table.

The document table is equipped with a platen glass 110 and a document pressure plate 111, and a reference white board 112 for making shading corrections.

Figure 2:
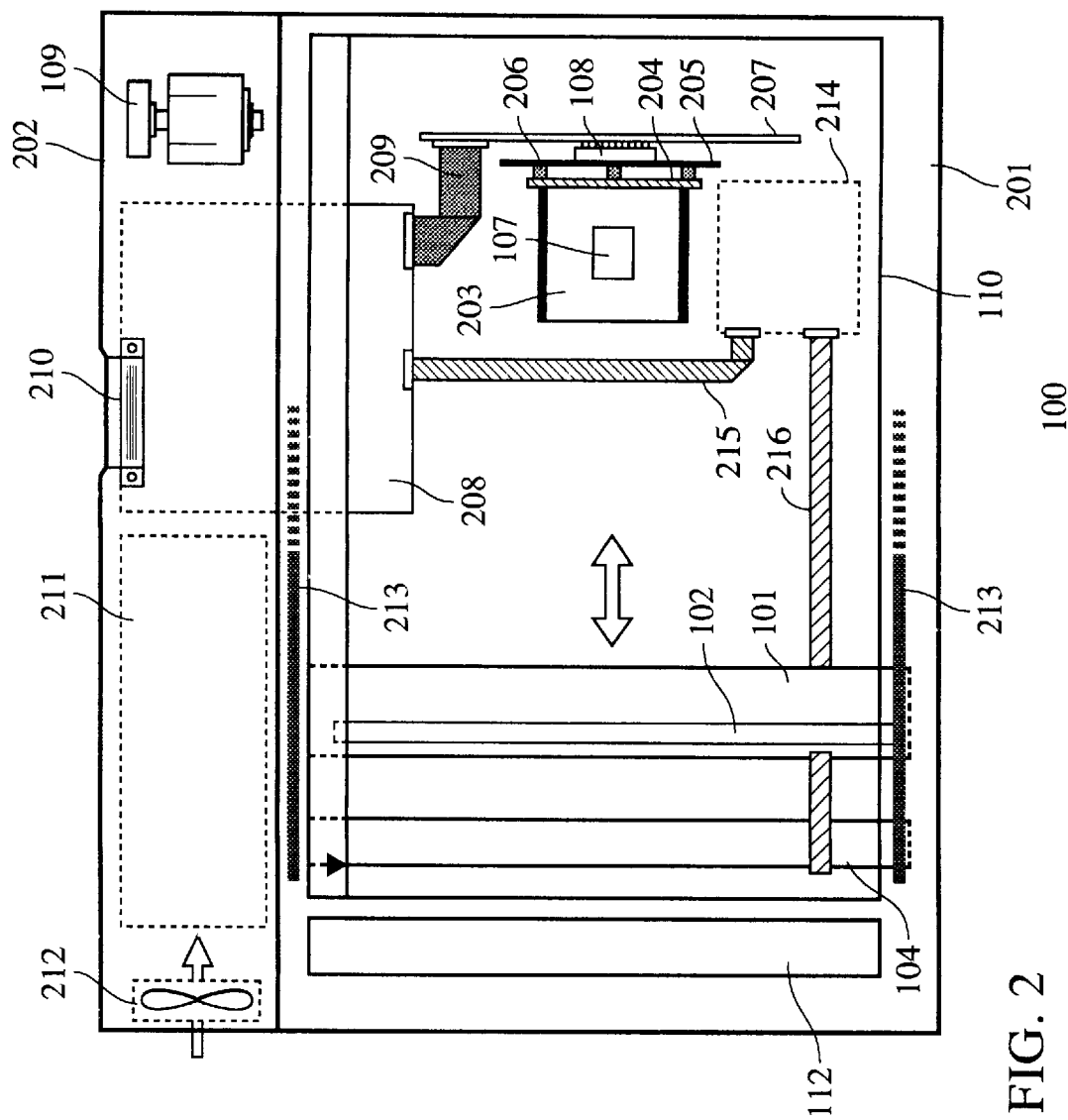
FIG. 2 is a top view of an image reading apparatus.

FIG. 2 shows the image reading apparatus 100 observed from above.

The image reading apparatus 100 is constructed by an optical box 201 equipped with the above optical system, and an electrical equipment box 202 incorporating electrical components, the two boxes being fixed to one another by welding or by a fixing member, such as a screw (not shown).

A lens 107 is secured on a lens mount 203, and the lens mount 203 undergoes a predetermined optical adjustment before it is fixed to the optical box 201. A CCD 108 is fixed to a CCD mounting sheet metal 205, subjected to an optical adjustment relative to a CCD fixing sheet metal 204 attached to the lens mount 203, and secured by fixing members 206. The fixing members 206 are formed by fixing unit, such as screws or solder.

A CCD driver board 207 for driving the CCD 108 is secured to the CCD mounting sheet metal 205 by a spacer or screw (not shown).

A reader control board (hereinafter referred to as "RCON board") 208 is responsible for control of the entire image reading apparatus 100 and for image processing. The RCON board 208 and the CCD driver board 207 are interconnected by a CCD driver cable 209. In this embodiment, the CCD driver cable 209 is a card type.

An inverter 214 drives the xenon lamp 102. The inverter 214 is controlled by the RCON board 208. The inverter 214 and the RCON board 208 are interconnected by an inverter cable 215 through which turning ON/OFF of the lamp, synchronization control, error control, etc. are carried out.

The inverter 214 and the xenon lamp 102 are interconnected by a lamp cable 216. The lamp cable 216 is routed from the inverter 214, passed under the first mirror base 101, folded back at the second mirror base 104, and connected to the first mirror base 101. Then, the lamp cable 216 supplies power to the xenon lamp 102 via a relay cable (not shown).

The image reading apparatus 100 is further provided with a power source 211 of the apparatus, and an axial flow fan 212 for cooling the apparatus and for a dustproof purpose. The axial flow fan 212 introduces outside air, and the pressure inside the apparatus is set slightly higher than an ambient pressure so as to prevent dust from coming into the apparatus. An inlet of the fan 212 is provided with a filter as necessary.

An external I/F connector 210 attached to the RCON board 208 is used for communication with an external printer (not shown) and for transmission of image signals.

A drive wire 213 is used to drive the first mirror base 101 and the second mirror base 104, a driving power being transmitted from an optical motor 109 via a pulley (not shown).

Figure 3:
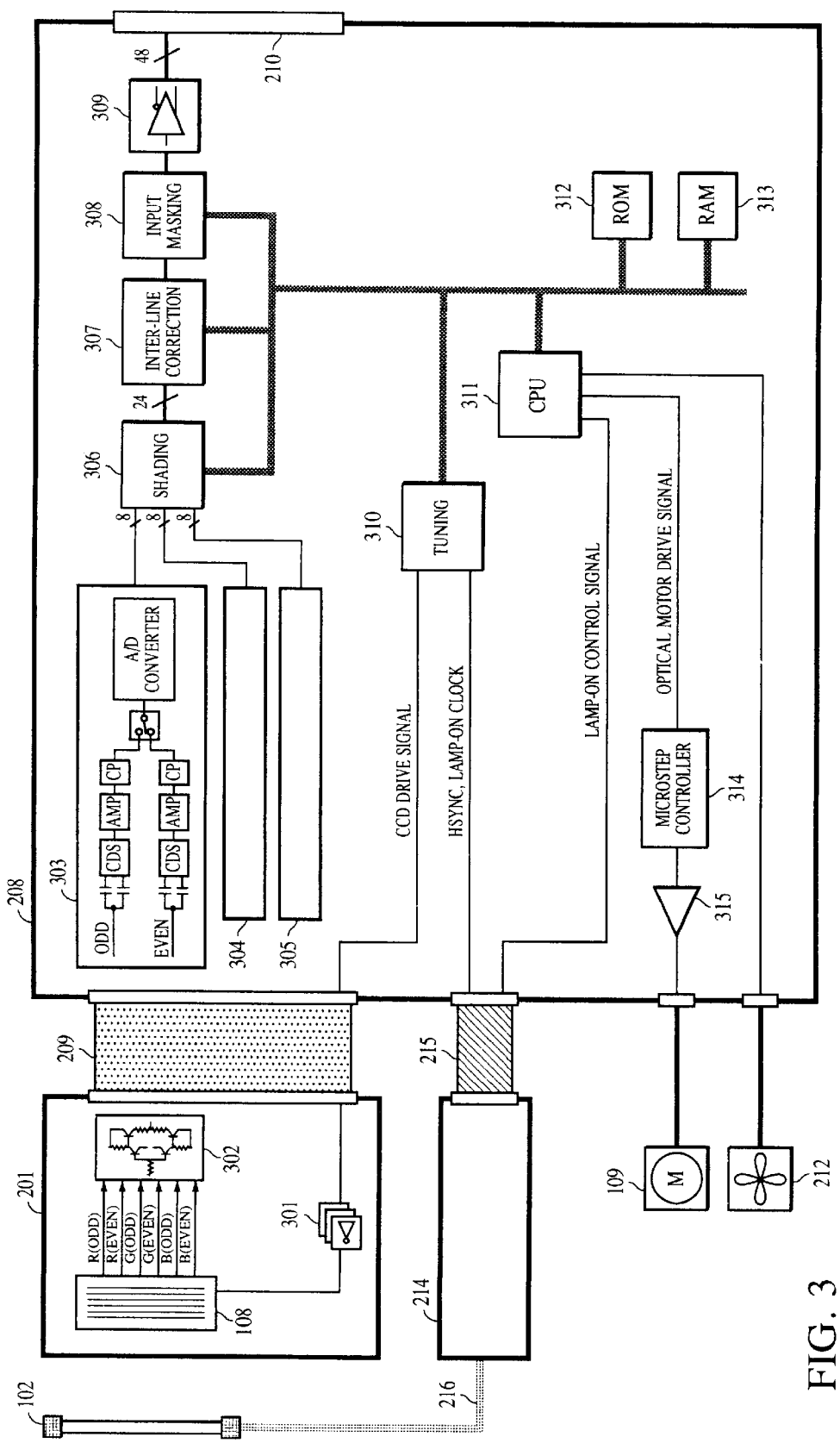
FIG. 3 is a circuit block diagram of the image reading apparatus.

FIG. 3 is a circuit block diagram of the image reading apparatus 100.

In this embodiment, the CCD line sensor 108 is a color three-line type for the R, G, and B colors. An output of each of the R, G, and B colors consists of two signals, namely, an odd-numbered pixel string signal (hereinafter referred to as "ODD signal") and an even-numbered pixel string signal (hereinafter referred to as "EVEN signal").

The six analog signals output from the CCD line sensor 108 are transmitted to the RCON board 208 via a push-pull buffer 302 and the CCD driver cable 209.

An analog processing circuit 303 for converting an R signal (ODD) and an R (EVEN) signal output from the CCD line sensor 108 into digital signals is constructed by a coupling capacitor, a correlative dual sampling circuit (hereinafter referred to as "ICDS circuit"), a gain control amplifier (hereinafter referred to as "AMP circuit"), a clamping circuit (hereinafter referred to as "CP circuit"), an analog switch, and an A/D converter.

Analog processing circuits 304 and 305 for processing the G signals and the B signals, respectively, share the same configuration as that of the analog processing circuit 303 for the R signals described above; hence, the details of the circuits 304 and 305 are not shown in FIG. 3.

The CCD output signals processed by the analog processing circuits 303 through 305 are output as 8-bit digital signals and supplied to a shading correction circuit 306.

The shading correction circuit 306 performs processing to normalize a black signal for OFF of the xenon lamp 102 and a white signal providing a read value of the reference white board 112.

An output of the shading correction circuit 306 is supplied to an inter-line correction circuit 307. The inter-line correction circuit 307 for correcting physical intervals of the three line sensors of the CCD line sensor 108 is constituted by a line memory, such as a FIFO memory, and an interpolation circuit.

Outputs of the inter-line correction circuit 307 are supplied to an input masking circuit 308. The input masking circuit 308 performs an RGB matrix operation to improve chromatic reproducibility. Operational parameters are changed as necessary if the emission spectrum characteristics of the xenon lamp 102 change or the xenon lamp 102 of a different manufacturer is used.

Outputs of the input masking circuit 308 are supplied to a differential driver 309. The differential driver 309 drives the I/F cable connected to the external I/F connector 210, and is of a low voltage differential signal (LVDS) type for reducing radiative noises and minimizing influences due to disturbance.

A CPU 311 for controlling the entire image reading apparatus 100 controls the shading correction circuit 306, the inter-line correction circuit 307, and the input masking circuit 308 via a CPU bus. The CPU 311 also controls turning ON of the xenon lamp 102, the drive of the optical motor 109, turning ON/OFF and speed of the fan 212, etc.

A ROM 312 storing programs and a RAM 313 for backup use exchange data with the CPU via the CPU bus.

A timing generating circuit 310 generates timing signals for the entire apparatus. CCD drive signals output from the timing generating circuit 310 are supplied to the CCD driver board 201 via the CCD driver cable 209, and a driver 301 drives the CCD line sensor 108. Furthermore, the timing generating circuit 310 supplies HSYNC signals and lamp-on clocks to the inverter 214 to conduct lamp-on control in synchronization with the video processing system. The timing generating circuit 310 is controlled via the CPU bus.

A microstep controller 314 generates drive pulses for microstep-driving the optical motor 109 based on drive clocks received from the CPU 311. A driver 315 drives outputs of the microstep controller 314.

Figure 4:
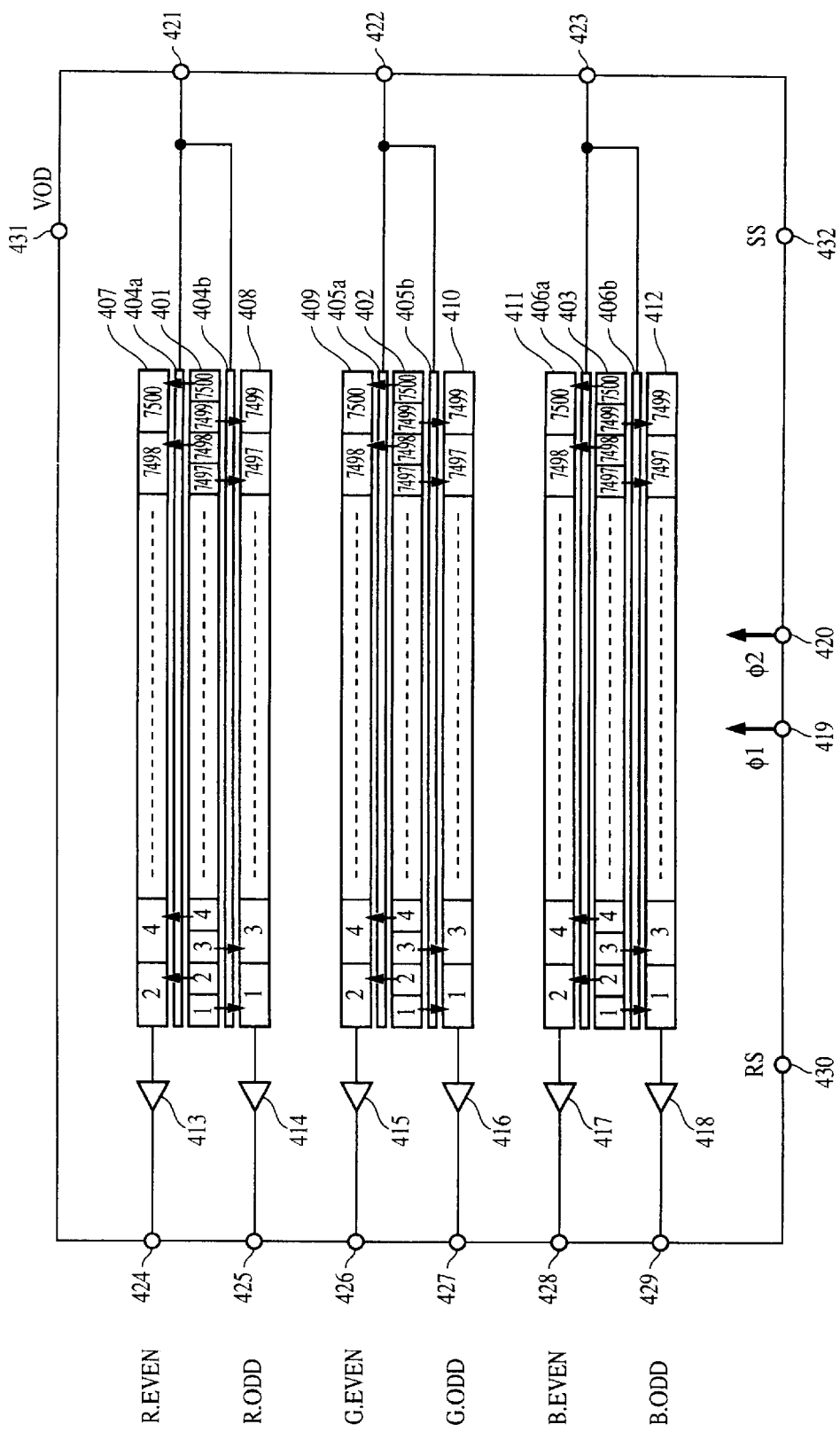
FIG. 4 is a circuit block diagram of a CCD line sensor of the image reading apparatus.

FIG. 4 is a circuit block diagram of the CCD line sensor 108. In the drawing, reference numerals 401, 402, and 403 denote a red (R) photodiode, a green (G) photodiode, and a blue (B) photodiode, respectively, (the photodiode will be hereinafter referred to as "PD"). The PDs 401 through 403 have, for example, 7500 pixels, and are capable of reading an A4-size document at 600 dpi.

Reference numerals 404, 405, and 406 denote shift registers (hereinafter referred to as "SH") for transferring charges stored at the PD 401 through 403 to CCD registers 407, 408, 409, 410, 411, and 412.

Of the SH's 407 through 412, the SH's 407, 409, and 411 denote CCD registers for transferring even-numbered pixels of the PDs 401 through 403, while SH's 408, 410, and 412 denote CCD registers for transferring odd-numbered pixels.

The even-numbered pixels and the odd-numbered pixels are separately transferred so as to drive the CCD line sensor 108 at high speed.

The charges transferred to the SH's 407 through 412 are horizontally transferred to output amplifiers 413, 414, 415, 416, 417, and 418 according to two-phase clocks of $\phi 1$ and $\phi 2$ supplied through transfer clock input terminals 419 and 420, respectively, then output through output terminals 424, 425, 426, 427, 428, and 429.

Signals R. EVEN, R. ODD, G. EVEN, G. ODD, B. EVEN, and B. ODD are respectively output from the output terminals 424 through 429.

Terminals 421, 422, and 423 receive SH pulses for driving SH gates 404 through 406, and the same signals are applied to these terminals.

Reference numeral 430 denotes an input terminal for RS pulses for resetting charge converting amplifiers of signals, reference numeral 431 denotes a power terminal of the CCD line sensor 108, and reference numeral 432 denotes a substrate (SS) terminal.

Figure 5:
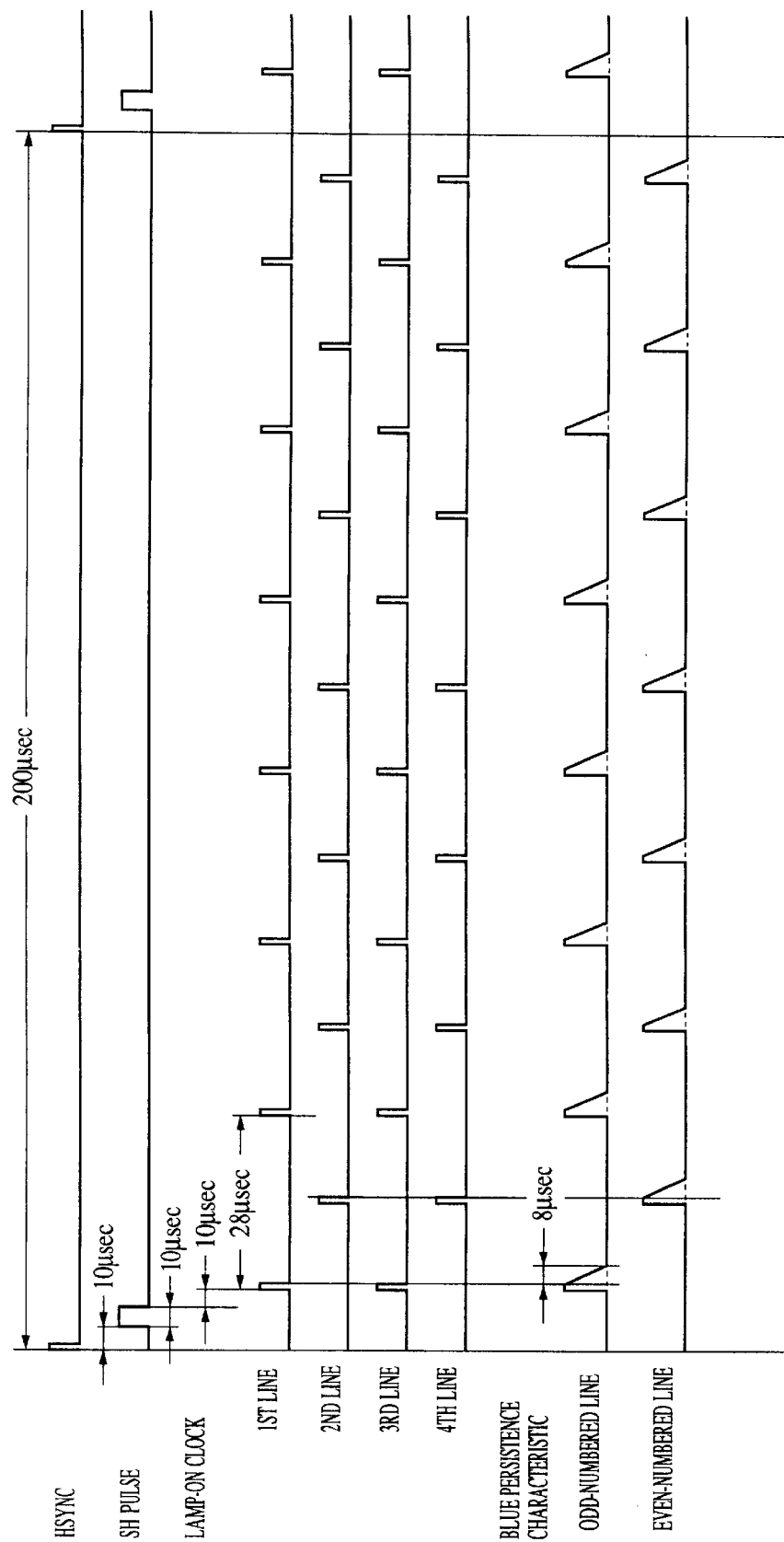
FIG. 5 is a timing chart of signals.

FIG. 5 is a timing chart illustrating a relationship between drive signals of the CCD line sensor 108 and lamp-on signals of the xenon lamp 102.

A cycle of the HSYNC pulse is 200 $\mu$sec. The SH pulses to be supplied to the shift gates of the CCD line sensor 108 rise with a 10-$\mu$sec delay from a fall of the HSYNC signal, then falls in 10 $\mu$sec. A lamp-on clock pulse is supplied from the timing generating circuit 310 to the inverter 214 with a 10-$\mu$sec delay from the moment the SH pulse falls.

The lamp-on clock pulse is 28 $\mu$sec, and a pulse having a clock duty of 1:27 is repeatedly issued. If the lamp-on phase of a fluorescent lamp is fixed relative to changes in a storage cycle, then the balance of the R (Red) and G (Green) is disturbed at the same location in every line due to the peculiar persistence characteristic of B (Blue). To avoid the disturbance in the balance at the same location, the phase of the fluorescent lamp is shifted based on the storage cycle. In this embodiment, the lamp-on clock phase is shifted 180 degrees for each line as shown in the drawing.

The afterglow of B (Blue) extinguishes in about 8 $\mu$sec from the moment the lamp-on clock switches to low level. Based on the lamp-on pulses, the phases of the odd-numbered lines and the even-numbered lines are reversed. Since the afterglows of R (Red) and G (Green) are both retained in the order of msec, their influences on the phase shifting for each line can be ignored.

The lamp-on clock is reset at the rise of the HSYNC signal. The period of time from the rise of the HSYNC signal to the rise of the SH pulse is set to be longer than the afterglow time 8 μsec of B (Blue).

The B (Blue) signal output of the CCD line sensor 108 represents a luminescent integral value during the rise of the SH pulse shown in FIG. 5. Luminescence takes place seven times for each of odd-numbered line and even-numbered line, and no afterglow extends to the next line, so that the B (Blue) signal output is stable.

Figure 6:
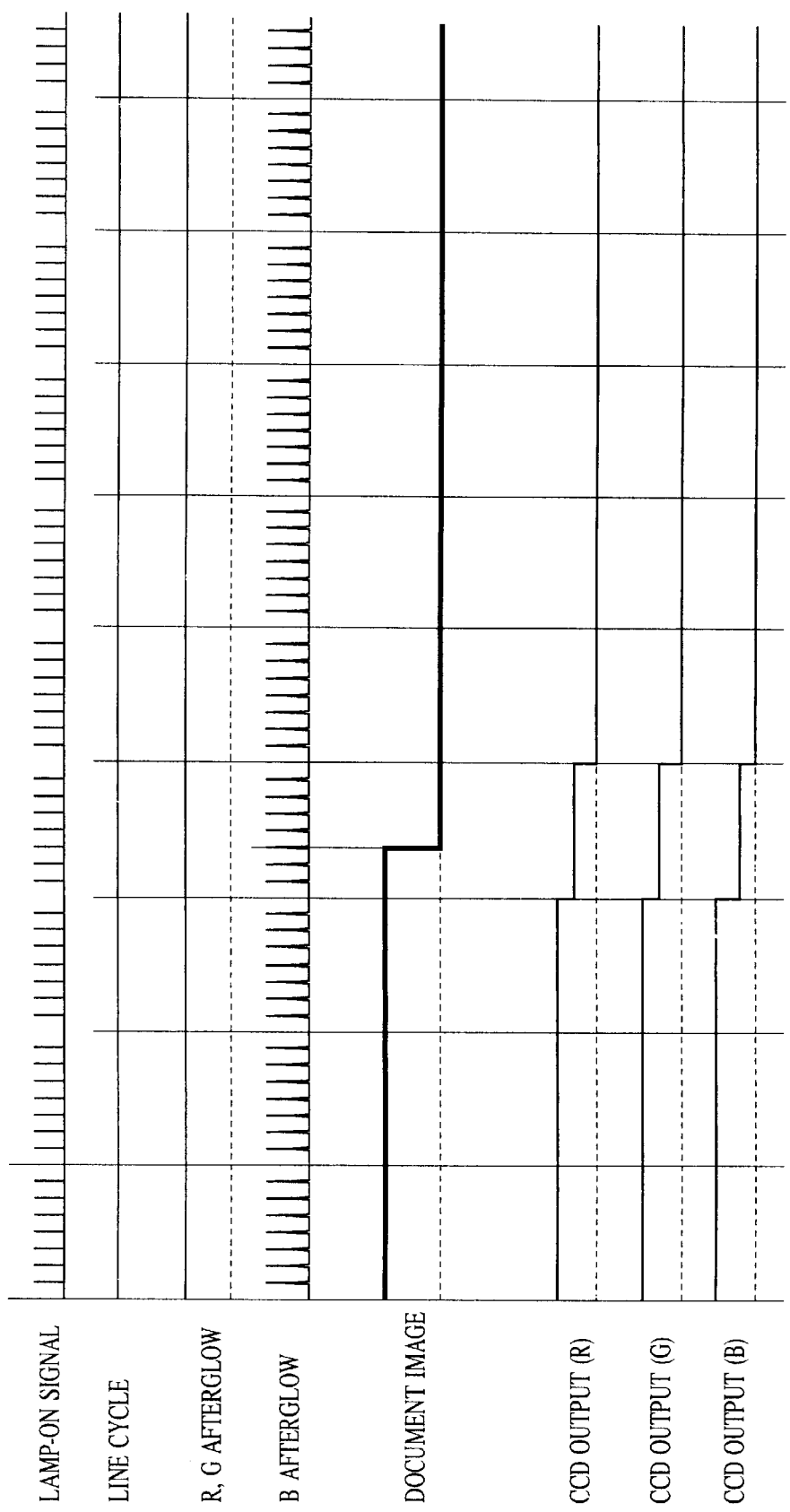
FIG. 6 is a diagram illustrating a color blur.

FIG. 6 illustrates influences on an edge during the vertical scanning of the document in this embodiment.

Figure 11:
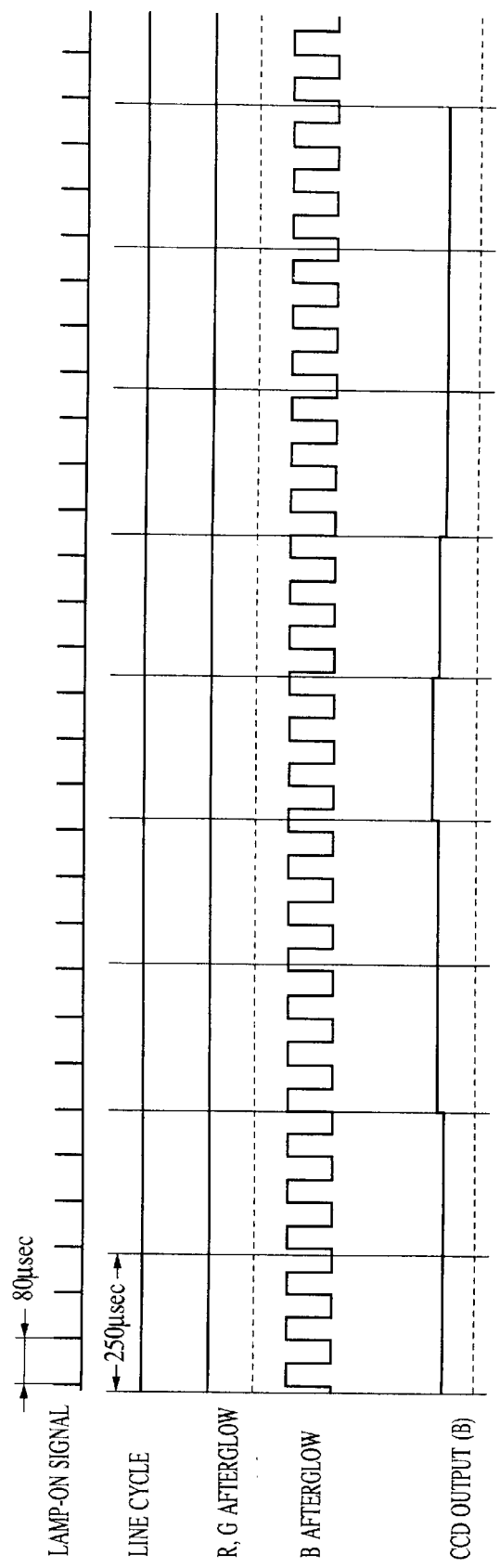
FIG. 11 is a diagram illustrating another problem with the prior art.
Figure 12:
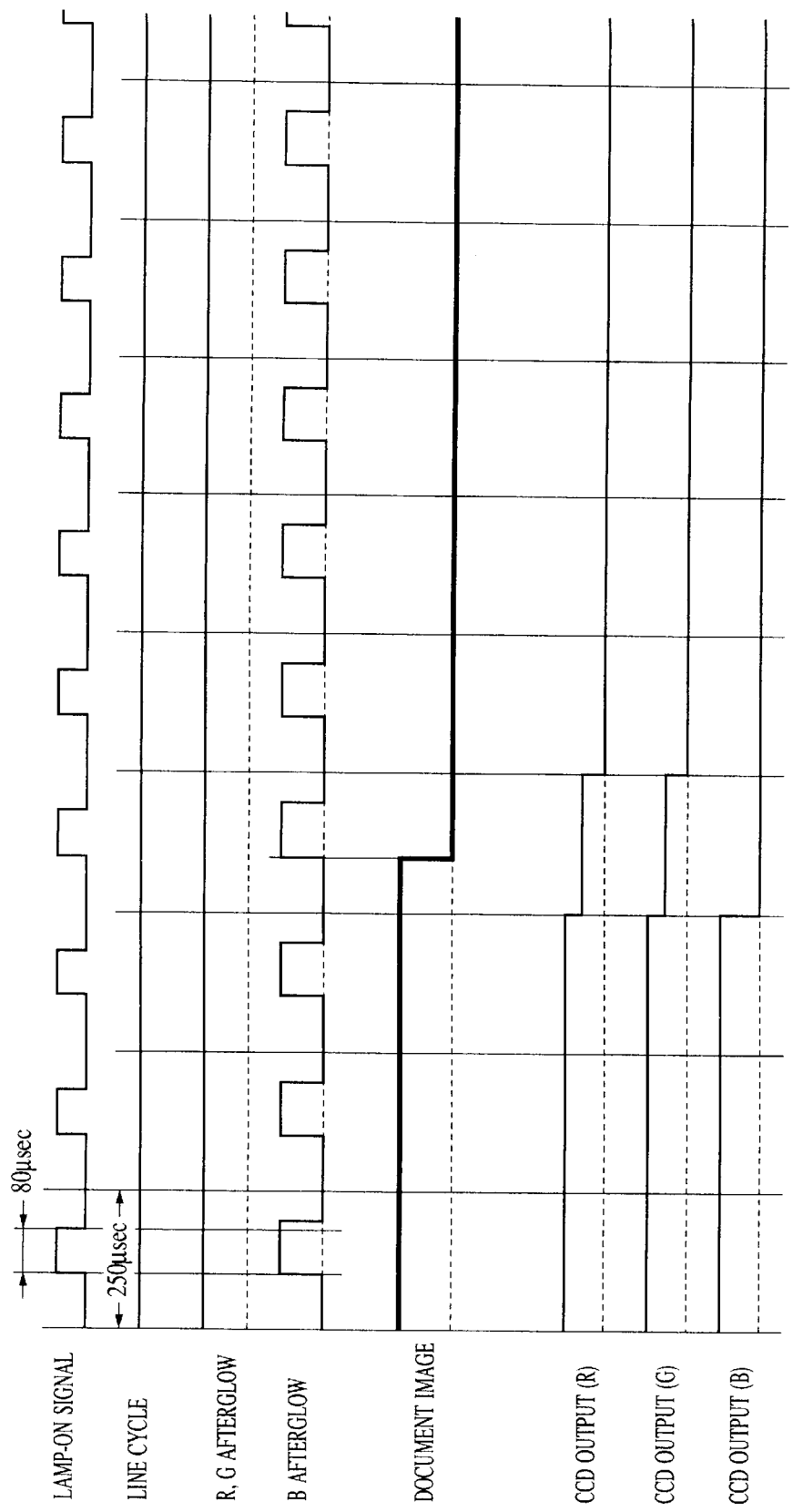
FIG. 12 is a diagram illustrating yet another problem with the prior art.

It can be seen that each line has a plurality of lamp-on points, allowing level differences among R, G, and B on the edge to be reduced as compared with the conventional example shown in FIG. 11.

Figure 7:
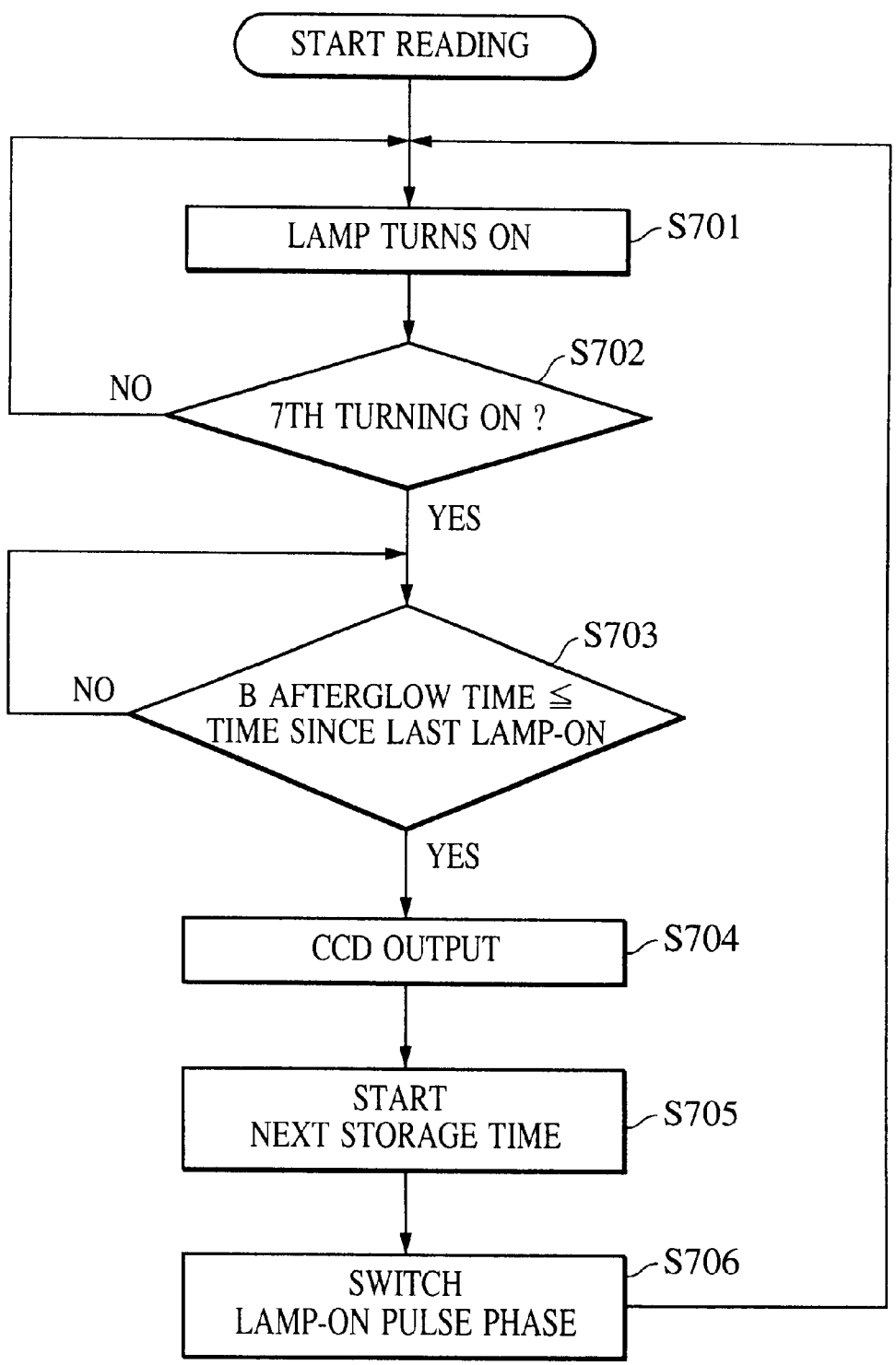
FIG. 7 is a timing chart of signals.

FIG. 7 illustrates a flow chart of the embodiment. The lamp turns ON in response to a lamp-on pulse (S701). In this embodiment, the lamp is turned ON a plurality of times (S702) to reduce the RGB level differences at the edge as compared with the conventional example shown in FIG. 11. Furthermore, in order to reduce the differences among R, G, and B in their persistence characteristics, CCD outputs are held (S703) for a time sufficient to avoid influences of the persistence characteristics, e.g., until a predetermined time passes since the last lamp-on in a storage time (the predetermined time in this case may be any time as long as it is longer than the afterglow time of B (Blue)) in this embodiment, then provided to transfer pixels (S704). This starts a storage time of the following image signal (S705), and the phase of the lamp-on pulse is changed (S706). This flow is repeated until reading an image is completed.

Thus, according to the embodiment, fluctuations in the output level attributable to the persistence characteristics of the RGB phosphors and color blurs taking place at edges of documents in the vertical scanning direction can be reduced.

Second Embodiment

A second embodiment of the present invention will now be described. A hardware configuration of an image reading apparatus according to the second embodiment is the same as that of the first embodiment described above; hence, the description of the hardware configuration will not be repeated.

Figure 8:
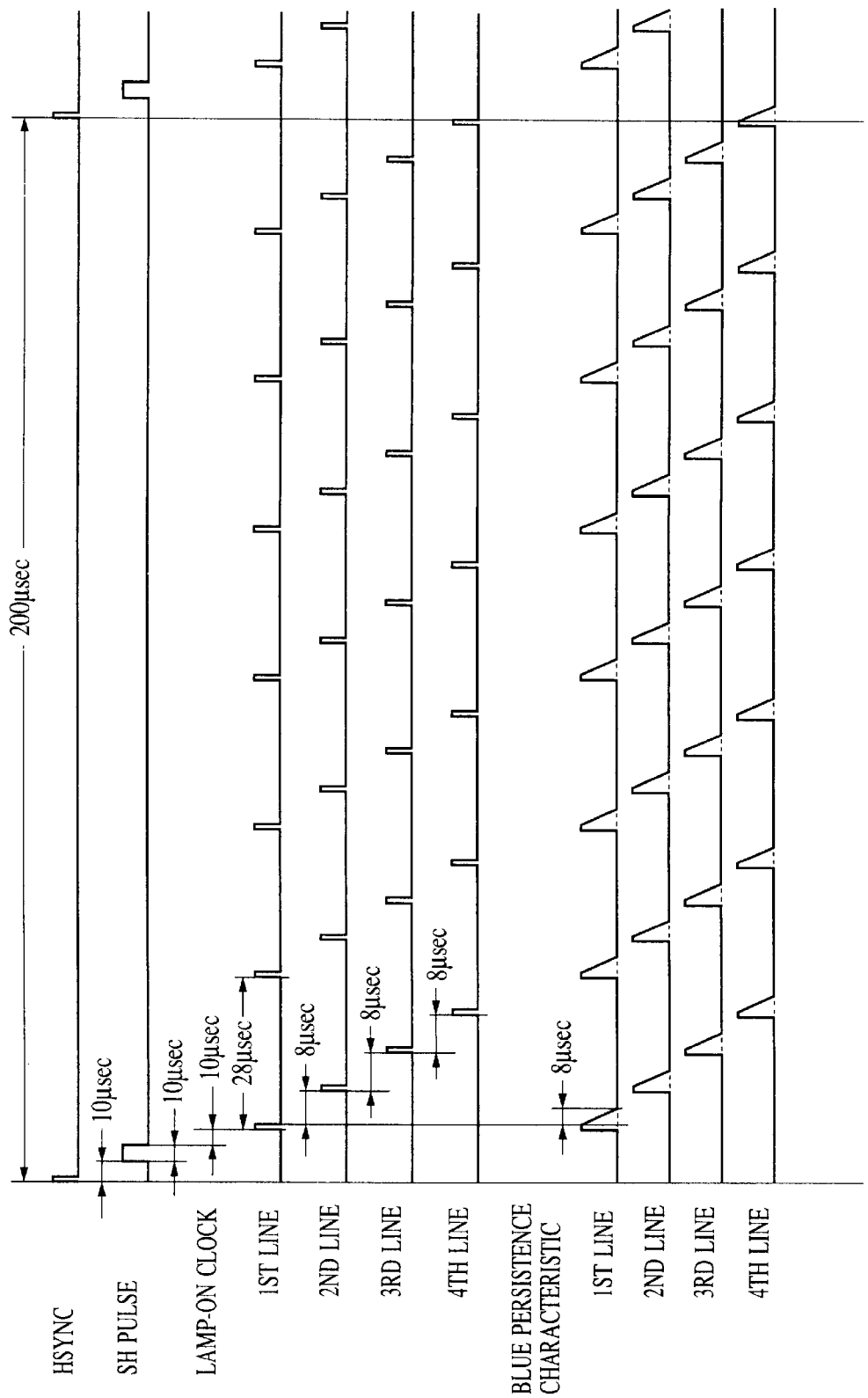
FIG. 8 is a graph illustrating emission spectrum characteristics of a white fluorescent lamp.
Figure 9:
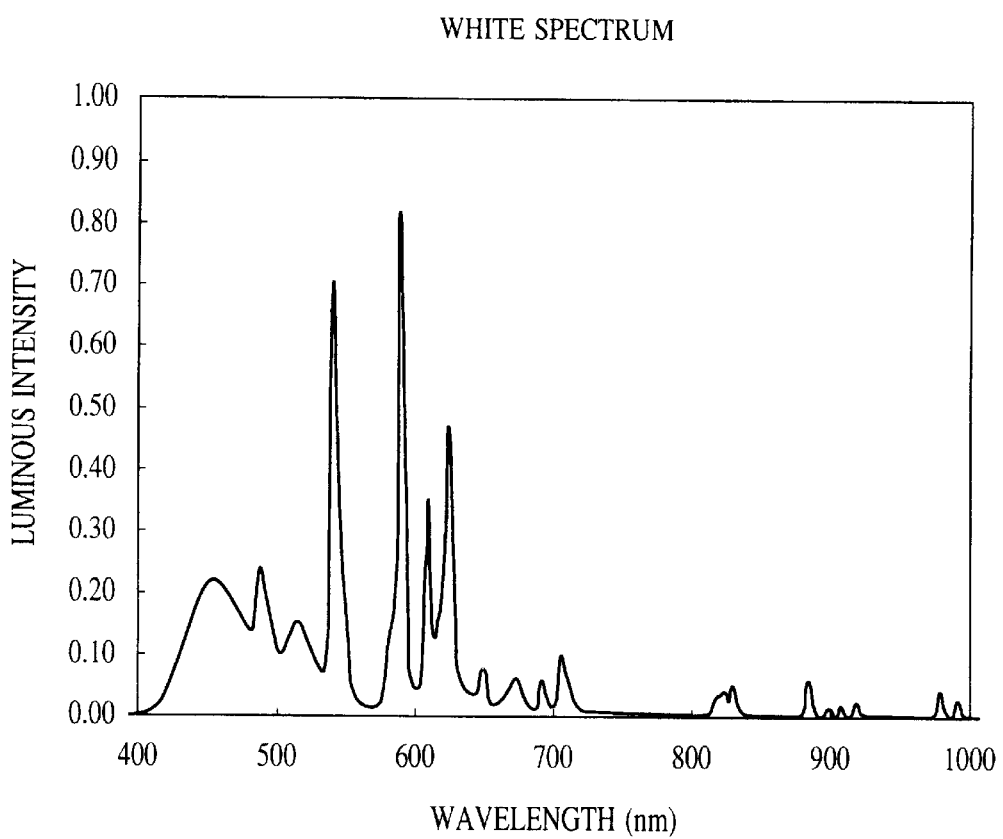
FIG. 9 is a diagram showing RGB persistence characteristics of a three-wavelength type fluorescent lamp.
Figure 10:
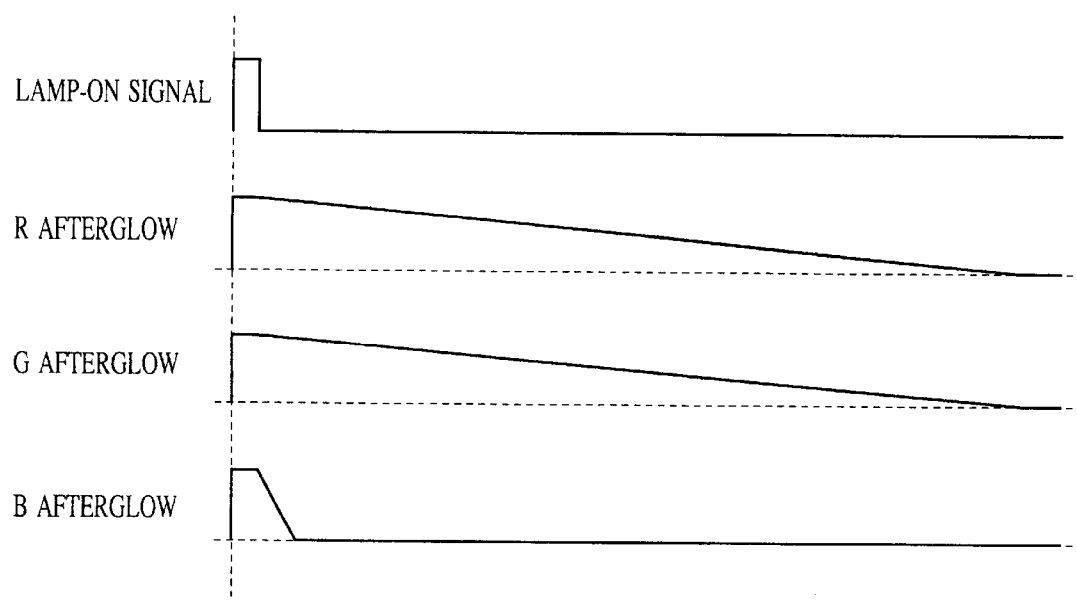
FIG. 10 is a diagram illustrating a problem with a prior art.

FIG. 8 is a timing chart showing a phase relationship between a HSYNC pulse and a lamp-on clock in the second embodiment.

In the second embodiment, the phase of the lamp-on clock is shifted 90 degrees for each line. On the fourth line, the lamp is turned ON substantially in synchronization with HSYNC signal. The period of time from the HSYNC pulse to an SH pulse, namely, 10 μsec, is longer than an afterglow time of B (Blue), namely, 8 μsec; therefore, the afterglow will not affect the next line.

Accordingly, the second embodiment also enables a CCD line sensor to provide stable B (Blue) signal outputs.

Moreover, fluctuations in the output level attributable to the persistence characteristics of the RGB phosphors and color blurs taking place at edges of documents in the vertical scanning direction can be both reduced.

Furthermore, it is obvious that the object of the present invention can be accomplished also by supplying a storage medium or a recording medium, in which program codes of software for implementing the functions of the embodiments described above, to a system or an apparatus so that a computer, a CPU, or an MPU of the system or the apparatus reads and executes the program codes stored in the storage medium. In this case, the program codes themselves read out from the storage medium will implement the functions of the foregoing embodiments, and the storage medium wherein the program codes have been stored will constitute the present invention. It is also obvious that the present invention includes an embodiment where an operating system (OS) running on a computer carries out a part or all actual processing to implement the functions of the aforesaid embodiments according to instructions of the program codes, in addition to the case where the functions of the foregoing embodiments are implemented by executing the program codes read by the computer.

The present invention also includes an embodiment where the program codes read from the storage medium are written to a feature expansion card inserted in a computer or a memory provided in a feature expansion unit connected to a computer, then a CPU or the like provided in the feature expansion card or the feature expansion unit carries out a part or all actual processing to implement the functions of the aforesaid embodiments according to instructions of the program codes.

While the present invention has been described with reference to what are presently considered to be the preferred embodiments, it is to be understood that the invention is not limited to the disclosed embodiments. The invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image reading apparatus comprising:

an illuminating unit adapted to illuminate a target;

a photoelectric converting unit adapted to read an image of a target illuminated by said illuminating unit; and a driving unit adapted to drive said illuminating unit such that said illuminating unit turns on a plurality of times during one storage period of time of said photoelectric converting unit in synchronization with a storage cycle of said photoelectric converting unit, and a lamp-on phase in a storage period of time is different from a lamp-on phase in another storage period of time.

2. An image reading apparatus according to claim 1, wherein said photoelectric converting unit comprises photoelectric converting elements arranged in lines.

3. An image reading apparatus according to claim 1, wherein said driving unit drives said illuminating unit such that said illuminating unit does not turn on at a timing when charges are transferred from said photoelectric converting unit.

4. An image reading apparatus according to claim 1, wherein said driving unit drives said illuminating unit such that a lamp-on phase is shifted based on a storage cycle of said photoelectric converting unit.

5. An image reading apparatus according to claim 1, wherein said illuminating unit is a fluorescent lamp, and a time from when said fluorescent lamp is turned on last within the storage period to when charges are transferred from said photoelectric converting unit is set to be longer than a shortest afterglow time of a phosphor of said fluorescent lamp.

6. An image reading apparatus according to claim 1, wherein said photoelectric converting unit photoelectrically converts lights having different wavelength ranges from each other, and a time from when said illuminating unit turns on last within the storage period of time to when charges are transferred from said photoelectric converting unit is set to be longer than a shortest afterglow time of a light among the lights having different wavelength ranges from each other.

7. An image reading apparatus according to claim 1, wherein the lamp-on phase is shifted 180 degrees for each of said storage cycle.

8. An image reading apparatus according to claim 1, wherein the lamp-on phase is shifted 90 degrees for each of said storage cycle.

9. An illumination driving method for an image reading paratus adapted to read, by means of a photoelectric converting it, a target illuminated by an illuminating unit, wherein the illuminating unit is turned on a plurality of times during one storage period of time of the photoelectric converting unit in synchronization with a storage cycle of said photoelectric converting unit, and a lamp-on phase in a storage period of time is different from a lamp-on phase in another storage period of time.

10. An illumination driving method according to claim 9, wherein said photoelectric converting unit is a line sensor comprising photoelectric converting elements arranged in lines.

11. An illumination driving method according to claim 9, wherein said illuminating unit is not turned on at a timing when charges are transferred from said photoelectric converting unit.

12. An illumination driving method according to claim 9, wherein said driving unit drives said illuminating unit such that a lamp-on phase of said illuminating unit is shifted for each storage cycle of said photoelectric converting unit.

13. An illumination driving method according to claim 9, wherein said illuminating unit is a fluorescent lamp, and a time from when said fluorescent lamp is turned on last within the storage period to when charges are transferred from said photoelectric converting unit is set to be longer than a shortest afterglow time of a phosphor of said fluorescent lamp.

14. An illumination driving method according to claim 9, wherein said photoelectric converting unit photoelectrically converts lights having different wavelength ranges from each other, and a time from when said illuminating unit turns on last within the storage period of time to when charges are transferred from said photoelectric converting unit is set to be longer than a shortest afterglow time of a light among the lights having different wavelength ranges from each other.

15. An illumination driving method according to claim 9, wherein the lamp-on phase is shifted 180 degrees for each of said storage cycle.

16. An illumination driving method according to claim 9, wherein the lamp-on phase is shifted 90 degrees for each of said storage cycle.

17. A storage medium storing a program for carrying out control such that an illuminating unit is turned on a plurality of times during one storage period of time of a photoelectric converting unit in synchronization with a storage cycle of said photoelectric converting unit and a lamp-on phase in a storage period of time is different from a lamp-on phase in another storage period of time when driving said illuminating unit to effect illumination of an image reading apparatus for reading, by means of said photoelectric converting unit, a target illuminated by said illuminating unit.

18. A program for carrying out control of an image reading apparatus by a computer such that an illuminating unit is turned on a plurality of times during one storage period of time of a photoelectric converting unit in synchronization with a storage cycle of said photoelectric converting unit and a lamp-on phase in a storage period of time is different from a lamp-on phase in another storage period of time when driving said illuminating device of said image reading apparatus for reading by said photoelectric converting unit, a target illuminated by said illuminating unit.

* * * * *

UNITED STATES PATENT AND TRADEMARK OFFICE
CERTIFICATE OF CORRECTION

PATENT NO.     : 6,741,373 B1
DATED          : May 25, 2004
INVENTOR(S)    : Noriyoshi Chizawa It is certified that error appears in the above-identified patent and that said Letters Patent is hereby corrected as shown below:

Column 2,
Line 52, "characteristic" should read -- characteristics --.

Column 3,
Line 53, "and" should be deleted; and
Line 55, "art." should read -- art; and --.

Column 5,
Line 12, "ICDS" should read -- CDS --.

Column 9,
Line 11, "paratus" should read -- apparatus --; and
Line 12, "it," should read -- unit, --.

Column 10,
Lines 20 and 31, "unit" should read -- unit, --;
Line 33, "device" should read -- unit to effect illumination --; and
Line 34, "Reading by" should read -- reading, by means of --.

Signed and Sealed this

Twenty-first Day of September, 2004

JON W. DUDAS
*Director of the United States Patent and Trademark Office*